United States Patent
Dowla et al.

(10) Patent No.: US 9,537,604 B2
(45) Date of Patent: *Jan. 3, 2017

(54) TRANSMIT-REFERENCE METHODS IN SOFTWARE DEFINED RADIO PLATFORMS FOR COMMUNICATION IN HARSH PROPAGATION ENVIRONMENTS AND SYSTEMS THEREOF

(71) Applicant: Lawrence Livermore National Security, LLC, Livermore, CA (US)

(72) Inventors: Farid Dowla, Castro Valley, CA (US); Faranak Nekoogar, San Ramon, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/612,205

(22) Filed: Feb. 2, 2015

(65) Prior Publication Data

US 2015/0270923 A1 Sep. 24, 2015

Related U.S. Application Data

(63) Continuation of application No. 12/795,571, filed on Jun. 7, 2010, now Pat. No. 8,971,441.

(Continued)

(51) Int. Cl.
*H03K 3/00* (2006.01)
*H04K 3/00* (2006.01)
(Continued)

(52) U.S. Cl.
CPC ............. *H04K 3/42* (2013.01); *H04B 1/0003* (2013.01); *H04K 3/44* (2013.01); *H04K 3/45* (2013.01);
(Continued)

(58) Field of Classification Search
CPC ......... H04B 1/0003; H04B 15/00; H04K 3/42; H04K 3/44; H04K 3/45; H04K 3/80; H04K 3/825; H04K 2203/00; H04K 2203/10; H04K 3/20
See application file for complete search history.

(56) References Cited

U.S. PATENT DOCUMENTS 3,021,523 A 2/1962 Davis et al.
4,780,721 A 10/1988 Dobson
(Continued)

FOREIGN PATENT DOCUMENTS

DE 3440666 A1 7/1990

OTHER PUBLICATIONS

Advisory Action from U.S. Appl. No. 12/795,571, dated Sep. 18, 2014.
(Continued)

*Primary Examiner* — Jean B Corrielus
(74) *Attorney, Agent, or Firm* — Zilka-Kotab PLC

(57) ABSTRACT

A method for adaptive Radio Frequency (RF) jamming according to one embodiment includes dynamically monitoring a RF spectrum; detecting any undesired signals in real time from the RF spectrum; and sending a directional countermeasure signal to jam the undesired signals. A method for adaptive Radio Frequency (RF) communications according to another embodiment includes transmitting a data pulse in a RF spectrum; and transmitting a reference pulse separated by a predetermined period of time from the data pulse; wherein the data pulse is modulated with data, wherein the reference pulse is unmodulated. A method for adaptive Radio Frequency (RF) communications according to yet another embodiment includes receiving a data pulse in a RF spectrum; and receiving a reference pulse separated in time from the data pulse, wherein the data pulse is modu- (Continued)

lated with data, wherein the reference pulse is unmodulated; and demodulating the pulses.

19 Claims, 6 Drawing Sheets

Related U.S. Application Data

(60) Provisional application No. 61/185,128, filed on Jun. 8, 2009.

(51) Int. Cl.
*H04B 1/00* (2006.01)
*H04W 4/22* (2009.01)

(52) U.S. Cl.
CPC ............... *H04W 4/22* (2013.01); *H03K 3/00* (2013.01); *H04K 2203/00* (2013.01)

(56) References Cited

U.S. PATENT DOCUMENTS

| | | | |
|---|---|---|---|
| 4,935,743 A | 6/1990 | Guilhem et al. | |
| 5,936,571 A | 8/1999 | Desjardins | |
| 6,118,805 A | 9/2000 | Bergstrom et al. | |
| 6,130,907 A | 10/2000 | Chen | |
| 6,549,562 B1* | 4/2003 | Olaker | H04B 1/69 375/139 |
| 6,690,746 B1 | 2/2004 | Sills et al. | |
| 7,305,052 B2 | 12/2007 | Spiridon et al. | |
| 7,515,627 B2 | 4/2009 | Liu et al. | |
| 8,094,679 B2 | 1/2012 | King | |
| 8,224,234 B1* | 7/2012 | Schuster | H04K 3/42 342/13 |
| 8,233,870 B2 | 7/2012 | Walley et al. | |
| 8,345,780 B2 | 1/2013 | Chauncey et al. | |
| 8,360,006 B2 | 1/2013 | Lechaton et al. | |
| 8,494,063 B1* | 7/2013 | Reudink | 370/252 |
| 8,509,701 B2 | 8/2013 | Selen et al. | |
| 8,971,441 B2 | 3/2015 | Dowla et al. | |
| 2002/0155811 A1 | 10/2002 | Prismantas et al. | |
| 2002/0172180 A1 | 11/2002 | Hall et al. | |
| 2003/0108133 A1* | 6/2003 | Richards | H04B 1/69 375/351 |
| 2004/0110508 A1* | 6/2004 | Haartsen | H04L 5/0005 455/445 |
| 2004/0131108 A1 | 7/2004 | Kyosti | |
| 2004/0202230 A1 | 10/2004 | Dowla et al. | |
| 2005/0001754 A1* | 1/2005 | Sparrow | G01S 7/38 342/13 |
| 2005/0003763 A1* | 1/2005 | Lastinger | H01Q 3/2605 455/63.1 |
| 2005/0143005 A1* | 6/2005 | Moore, III | H04B 7/18521 455/13.1 |
| 2006/0087472 A1* | 4/2006 | Troutman | F42C 11/008 342/68 |
| 2006/0209922 A1* | 9/2006 | Sahinoglu | H04B 1/7176 375/130 |
| 2007/0216572 A1 | 9/2007 | Schnabel | |
| 2007/0237065 A1 | 10/2007 | Kim et al. | |
| 2007/0291834 A1 | 12/2007 | Toumazou et al. | |
| 2008/0111653 A1* | 5/2008 | Lee | H03K 5/131 333/24 R |
| 2008/0146178 A1 | 6/2008 | Lu et al. | |
| 2008/0219206 A1* | 9/2008 | Agarwal | H04B 7/18528 370/316 |
| 2008/0227446 A1* | 9/2008 | Wubker | H04B 1/3805 455/427 |
| 2008/0239961 A1 | 10/2008 | Hilerio et al. | |
| 2008/0250243 A1* | 10/2008 | Bretheim | H04L 9/3271 713/168 |
| 2009/0052560 A1* | 2/2009 | She | H04B 7/0413 375/260 |
| 2009/0061759 A1 | 3/2009 | Stoddard et al. | |
| 2009/0074119 A1 | 3/2009 | Nekoogar et al. | |
| 2009/0075654 A1 | 3/2009 | Lu et al. | |
| 2009/0082065 A1 | 3/2009 | Kwak | |
| 2009/0092058 A1* | 4/2009 | Beaulieu | H04B 1/71637 370/252 |
| 2009/0140854 A1 | 6/2009 | Golander | |
| 2009/0156116 A1* | 6/2009 | Sheby | H04K 3/42 455/1 |
| 2009/0214205 A1 | 8/2009 | Clark et al. | |
| 2009/0237289 A1 | 9/2009 | Stoddard | |
| 2009/0258669 A1 | 10/2009 | Nie et al. | |
| 2009/0290670 A1* | 11/2009 | Eng | H04B 1/7172 375/360 |
| 2009/0310593 A1 | 12/2009 | Sheynblat et al. | |
| 2010/0026548 A1 | 2/2010 | Weissman et al. | |
| 2010/0102065 A1* | 4/2010 | Phelan | B63B 1/041 220/560 |
| 2010/0150286 A1 | 6/2010 | Casabona et al. | |
| 2010/0185541 A1 | 7/2010 | Hassan et al. | |
| 2010/0296262 A1 | 11/2010 | Kim et al. | |
| 2010/0309951 A1 | 12/2010 | Dowla et al. | |
| 2010/0316098 A1 | 12/2010 | Pals et al. | |
| 2010/0323654 A1 | 12/2010 | Judson et al. | |
| 2011/0201326 A1 | 8/2011 | Karabinis | |
| 2012/0020280 A1* | 1/2012 | Jansson | H04B 7/18582 370/316 |
| 2012/0154213 A1 | 6/2012 | Bull et al. | |

OTHER PUBLICATIONS

Hoctor et al., "An Overview of Delay-Hopped, Transmitted-Reference RF Communications," GE Research & Development Center, Jan. 2002, pp. 1-29.

Van Stralen et al., "Delay Hopped Transmitted Reference Experimental Results," IEEE Conference on Ultra Wideband Systems and Technologies, May 2002, pp. 93-98.

Zhang Q., "Slightly frequency-shifted reference ultra-wideband radio," Dissertation from University of Massachusetts, Amherst, May 2007 (abstract only).

Non-Final Office Action from U.S. Appl. No. 12/795,571, dated Mar. 5, 2013.

Final Office Action from U.S. Appl. No. 12/795,571, dated Jul. 22, 2013.

Non-Final Office Action from U.S. Appl. No. 12/795,571, dated Jan. 23, 2014.

Final Office Action from U.S. Appl. No. 12/795,571, dated Jun. 9, 2014.

Notice of Allowance from U.S. Appl. No. 12/795,571, dated Oct. 22, 2014.

Dowla et al., U.S. Appl. No. 12/795,571, filed Jun. 7, 2010.

* cited by examiner (a)

(b)

Overall signal energy is increased

TRANSMIT-REFERENCE METHODS IN SOFTWARE DEFINED RADIO PLATFORMS FOR COMMUNICATION IN HARSH PROPAGATION ENVIRONMENTS AND SYSTEMS THEREOF

RELATED APPLICATIONS

This application is a continuation of U.S. patent application Ser. No. 12/795,571, filed Jun. 7, 2010, now, U.S. Pat. No. 8,971,441, which claims benefit of U.S. Provisional Pat. App. No. 61/185,128, filed Jun. 8, 2009, from each of which priority is claimed and which are all herein incorporated by reference.

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to Transmit-Reference (TR) methods, and more particularly, to systems and methods for TR methods in Software Defined Radio (SDR) platforms for communications in harsh propagation environments.

BACKGROUND

Reliable wireless communications inside ships and from ship-to-shore has become an increasingly daunting challenge for maritime operations. The heavy metallic environment of a ship, including the ship's hull, as well as the reflections from the water surrounding the ship create a hostile transmission environment for Radio Frequency (RF) signals that cause most commercial wireless systems to fail to provide reliable communications.

Therefore, a communications platform which allows voice, image, and data to be transmitted and received in a harsh propagation environment would be very beneficial to communications in these environments.

SUMMARY

According to one embodiment, a method for adaptive Radio Frequency (RF) jamming includes: dynamically monitoring a RF spectrum; detecting any undesired signals in real time from the RF spectrum; and sending a directional countermeasure signal to jam the undesired signals. The directional countermeasure signal is adaptively generated in real-time according to a bandwidth of the undesired signals, the bandwidth of the undesired signals being in a range from a narrow bandwidth to an ultra-wide bandwidth (UWB). The directional countermeasure signal is sent by a directional antenna that directs the directional countermeasure signal towards a source of the undesired signals.

According to another embodiment, a Radio Frequency (RF) communications system includes one or more ultra-wideband (UWB) radios. Each UWB radio is a software-defined radio (SDR) system comprising: a processor configured to execute software; and software configured to cause the SDR system to perform an interference modulation technique to adaptively jam at least two undesired signals simultaneously. Performing the interference modulation technique to adaptively jam the at least two undesired signals includes emitting one or more jamming signals towards a source of the at least two undesired signals, the one or more jamming signals being characterized by a signal bandwidth ranging from narrow-band to ultra-wideband. The one or more UWB radios are each configured to communicate with a satellite uplink base station using wireless communications that are controlled by the SDR system thereof. The one or more UWB radios each comprise one or more interfaces for coupling to one or more endpoint devices.

According to yet another embodiment, a method for adaptive Radio Frequency (RF) communications includes: transmitting a data pulse in a RF spectrum; and transmitting a reference pulse separated by a predetermined period of time from the data pulse, where the data pulse is modulated with data, and where the reference pulse is unmodulated.

According to a further embodiment, a method for adaptive Radio Frequency (RF) communications includes: receiving a data pulse in a RF spectrum, where the data pulse is modulated with data; receiving a reference pulse separated in time from the data pulse, where the reference pulse is unmodulated; and demodulating the pulses.

Other aspects and embodiments of the present invention will become apparent from the following detailed description, which, when taken in conjunction with the drawings, illustrate by way of example the principles of the invention.

DETAILED DESCRIPTION

Figure 1:
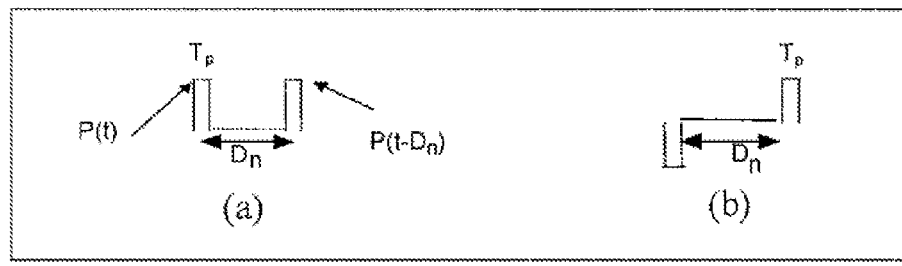
FIG. 1 is a simple schematic diagram showing multipulse modulation, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a method for adaptive Radio Frequency (RF) jamming includes dynamically monitoring a RF spectrum; detecting any undesired signals in real time from the RF spectrum; and sending a directional countermeasure signal to jam the undesired signals.

In another general embodiment, a method for adaptive Radio Frequency (RF) communications includes transmitting a data pulse in a RF spectrum; and transmitting a reference pulse separated by a predetermined period of time from the data pulse; wherein the data pulse is modulated with data, wherein the reference pulse is unmodulated.

In yet another general embodiment, a method for adaptive Radio Frequency (RF) communications includes receiving a data pulse in a RF spectrum; and receiving a reference pulse separated in time from the data pulse, wherein the data pulse is modulated with data, wherein the reference pulse is unmodulated; and demodulating the pulses.

In one general embodiment, a system for adaptive Radio Frequency (RF) jamming includes logic configured to dynamically monitor a RF spectrum; logic configured to detect any undesired signals in real time from the RF spectrum; and logic configured to send a directional countermeasure signal to jam the undesired signals.

Advanced signal processing in various classes of Transmit-Reference (TR) and time reversal techniques is typically quite computationally intensive and limiting when implemented in hardware. When it comes to narrow pulses, such as wideband and ultra-wideband (UWB) systems, delay elements become very challenging, especially for low power hardware implementation.

According to one embodiment, an adaptive Radio Frequency (RF) jamming system may be based on Software Defined Radio (SDR) techniques that can dynamically monitor the RF spectrum to detect and jam intrusion detection signals in real time.

The adaptive RF jamming system based on SDR techniques may dynamically monitor the RF spectrum to detect and jam microwave radiation detector sensors volumetrically. Using this technique, the RF spectrum can be scanned adaptively over a wideband of frequencies and intrusion detection signals may be detected in real time. Once the undesirable or unwanted frequencies are detected, an RF jammer may actively send a strong and directional countermeasure signal to jam such signals. This highly directional adaptive jammer provides an effective method for real time jamming of unwanted external signals, in one approach, without interfering with friendly communication devices sending desired or wanted signals (or at least not the undesired frequencies). Depending on the nature of interfering waveforms, various jamming signals can be generated on the jammer in real time in an adaptive mode-ranging from narrow-band to focus on a very narrow part of the spectrum to wideband and ultimately ultra-wideband (UWB) to cover a very wide range of frequencies that can handle jamming of many interferers at once.

In another embodiment, a communications platform is presented which may allow maritime search members to communicate voice and/or data back to a central location for analysis and for coordination of the search team. A system according to one embodiment comprises three components: a satellite uplink base station, the UWB SDR radio systems, and the endpoint devices. This communications platform may make use of the Emergency Communications Network for its communications backbone, although this is not required, as other communications networks may be used as would be known to one of skill in the art.

In one embodiment, a base station comprises a router, a power supply, and a broadband global area network (BGAN) satellite uplink that can maintain the uplink while the base station is in motion. The radio system, in one embodiment, is a SDR that utilizes a UWB approach. The endpoint devices may be based on commercial off the shelf (COTS) technology, such as a personal digital assistant (PDA), Ultra Micro PC (UMPC), APPLE iPAD, mobile smartphone, etc., with a UWB radio interface. These endpoint devices may be rugged enough for long term maritime environmental use. The compact system may have robust links for communications inside ships, as well as from ship-to-shore. The frequency, modulation, and interference mitigation techniques may be integrated to overcome the problems faced in such scenarios. The link capacity may be able to handle video, voice and/or data.

A system in another embodiment includes a UWB SDR radio system having at least one antenna and signal processing logic, preferably configurable logic.

According to one embodiment, the UWB system may be based on analog equalization-modulation techniques. These equalization-modulation techniques, called multipulse modulation, offer advantages over conventional UWB modulation techniques (i.e., pulse position modulation) in terms of channel estimation, relaxed synchronization requirements, and exploiting multipath reflections for improving signal-to-noise ratio.

The multipulse modulation, according to one embodiment, comprises transmitting a pair of pulses or doublets separated in time. The first pulse in a transmitted doublet is modulated with data, known as the data pulse. After a defined time interval (D), the data pulse is followed by an unmodulated pulse, called a reference pulse, that does not carry any information. The individual pulses in the waveform may be any variety of wideband pulses, such as Gaussian, chirp, Hermite-based narrow pulses, etc. Data is modulated based on the relative polarity of the reference and data pulses, in one approach. For instance, a reference and a data pulse of the same polarity may designate a binary value of 1, while a data pulse opposite in polarity to the reference pulse may respond to a binary value of 0, as shown in FIG. 1, according to one embodiment. The inverse may also be true, where a reference and a data pulse of the same polarity may designate a binary value of 0, while a data pulse opposite in polarity to the reference pulse may respond to a binary value of 1. FIG. 1 is an embodiment of a multipulse modulation. P(t) represents the data pulse (polarity modulated by data), $P(t-D_n)$ represents the delayed unmodulated reference pulse, $T_p$ represents the pulse duration, and $D_n$ represents the time interval between the two pulses which is known to the receiver. (a) shows the symbol for data bit "1," according to one embodiment. (b) shows the symbol for data bit "0," in one embodiment.

Like the conventional matched filter receivers used in all other known UWB systems, the multipulse receivers use a correlation scheme, in one embodiment, but with a major distinction. Instead of correlating the received pulses with a predefined, "clean" template that has not experienced any channel distortions, a multipulse receiver correlates the received signal with a delayed version of itself. This way, each reference pulse acts as a template for its preceding data pulse. Therefore, the interval D plays a role in recovering data at the receiver.

Figure 2:
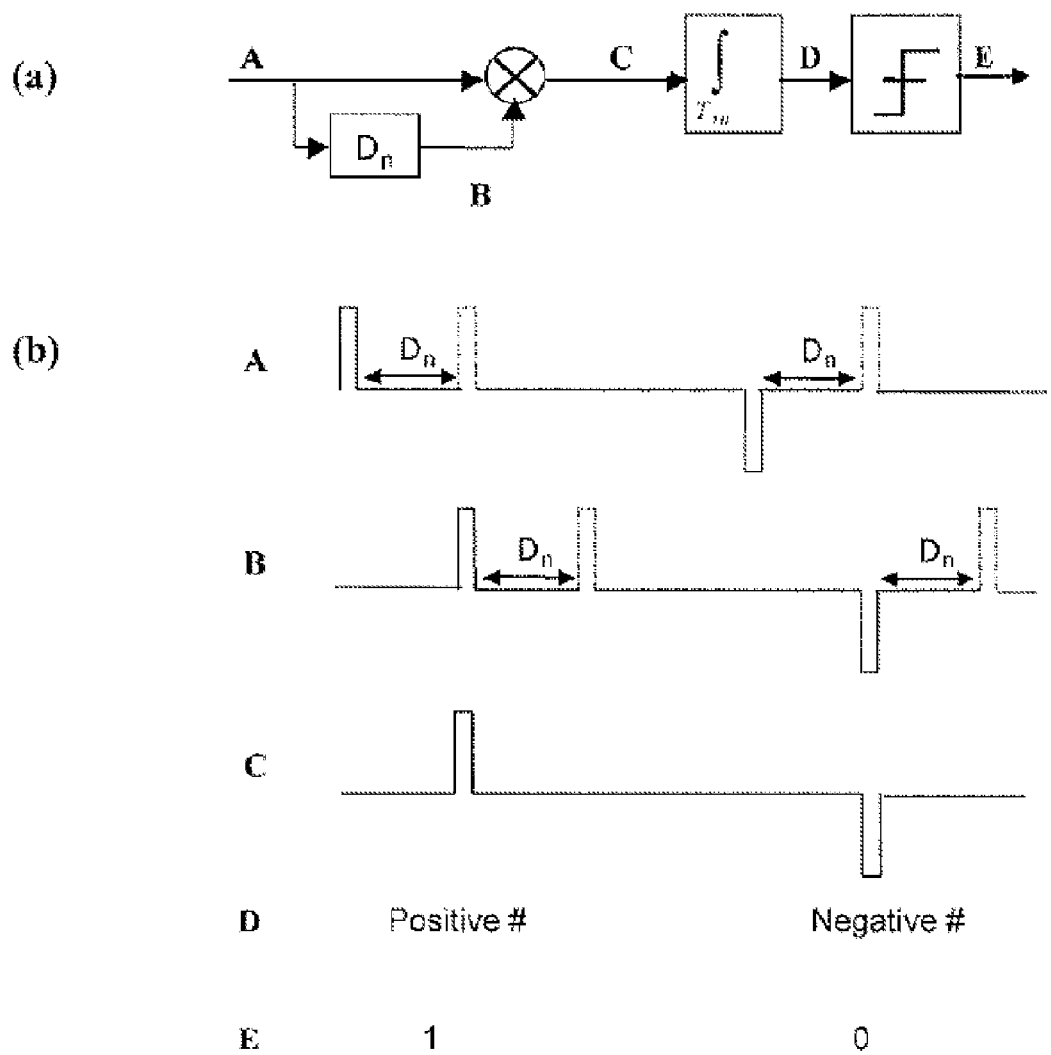
FIG. 2 shows a block diagram of a multipulse receiver according to one embodiment, and graphical examples of TR demodulation.

FIG. 2 shows a block diagram of a multipulse receiver, in one embodiment, followed by a simple example of multipulse demodulation. In FIG. 2, (a) is a block diagram of a multipulse receiver. $D_n$ represents the delay between the pulses shown in FIG. 1, and (b) is a graphical example of TR demodulation, in one embodiment. Dotted-line pulses represent the reference pulse, and solid-line pulses represent transmit pulses.

Since multipath channels can stretch the UWB pulse at the receiver and cause pulse overlap, detection becomes challenging based on conventional pulse detection techniques. On the other hand, the multipulse receivers exploit reflected signals from multiple surfaces to improve their signal-to-noise-ratio (SNR), according to one approach. This is because the reference and data pulses in transmitted doublets (shown in FIG. 1) are similar and correlated with each other. Therefore, they both are stretched the same way by reflections and the similarity will always be there. In other words, the strong multi-path components in the received signal contain significant energy and the ability to capture that energy by correlating the received signal by its delayed version is useful in low-power UWB communication systems, as shown in FIG. 3.

Figure 3:
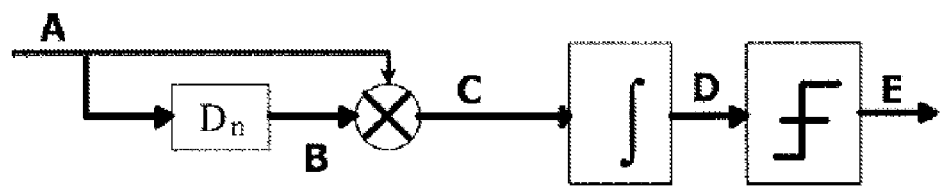
FIG. 3 shows a block diagram of a multipulse receiver according to one embodiment, and signal representations of a multipulse receiver in multipath channels, according to one embodiment.
Figure 3:
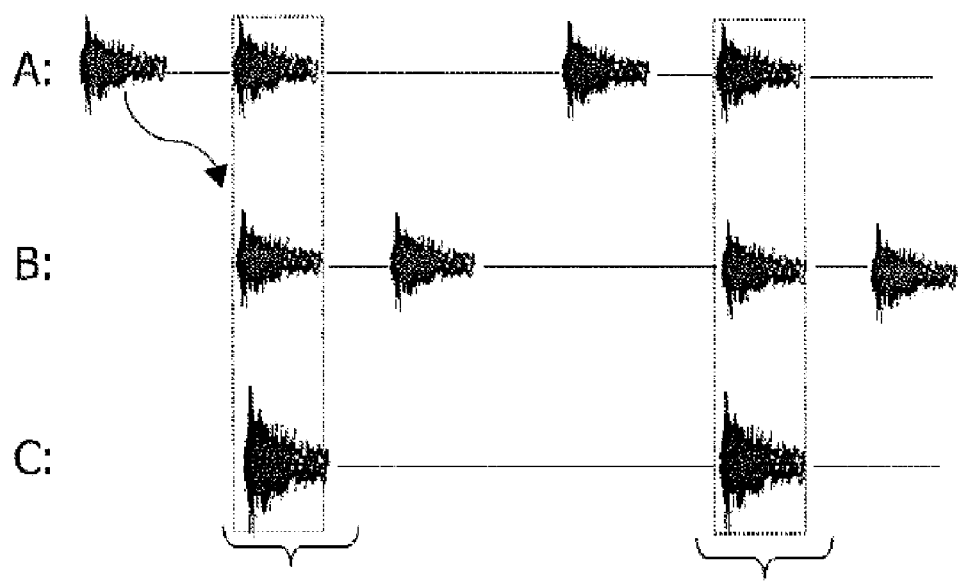

In FIG. 3, (a) is a block diagram of a multipulse receiver, according to one embodiment, and $D_n$ represents the delay between the reference and data pulses shown in FIG. 1. (b) shows a signal representation of a multipulse receiver in multipath channels. Compared to signals in FIG. 1, the signals here are stretched due to multipath effect. Since both reference and data pulse are stretched the same way, due to passing through the same channel, the signal energy for correlation is stronger.

Figure 4:
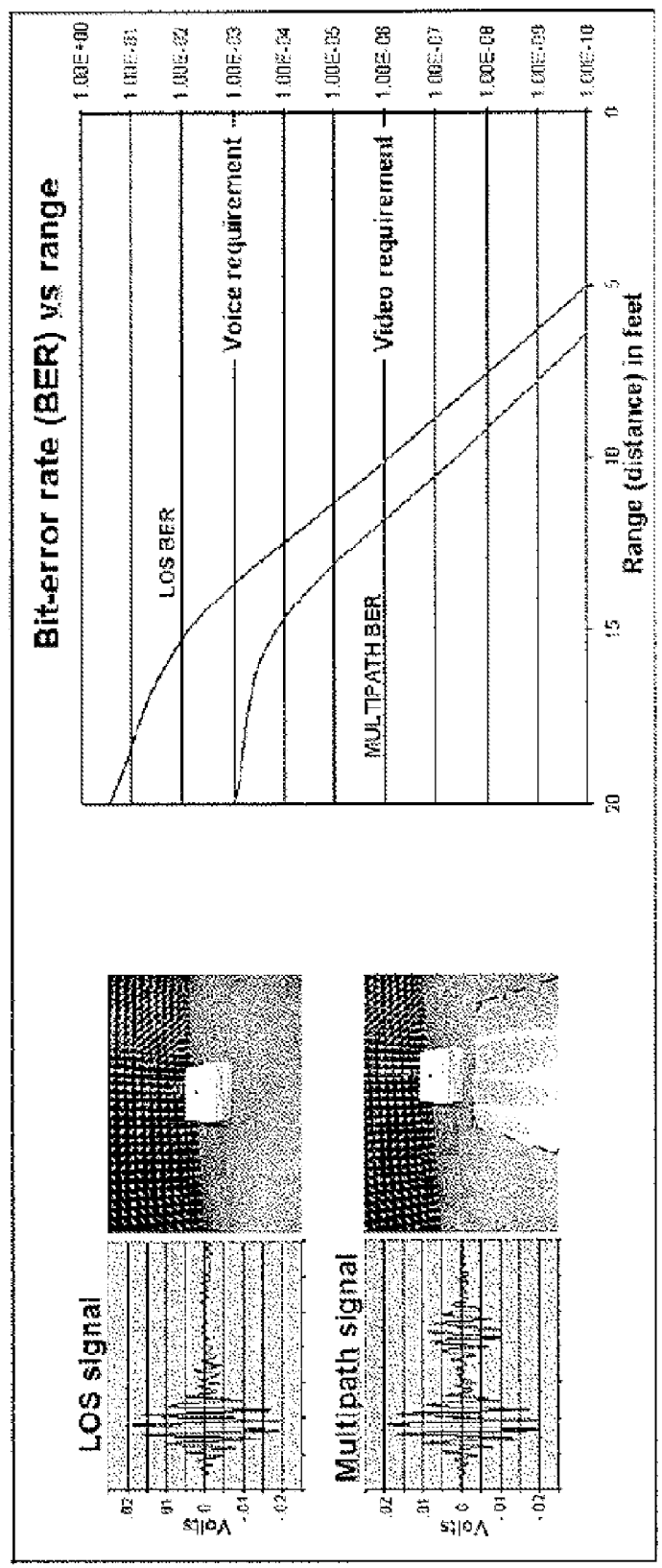
FIG. 4 shows how multipath sources can enhance UWB communications, according to one embodiment.

Laboratory experiments have shown that multi-path energy can enhance the performance of coherent UWB transmissions. To illustrate this, a receiver was placed in an anechoic chamber and bit error rate (BER) measurements were made at various ranges with and without multi-path interference. As seen in FIG. 4, BER performance is improved in the presence of multi-path interference. UWB systems with omni-antennas can often outperform directional antennas. Single-antenna narrow-band systems do not typically demonstrate this advantage.

Currently, a challenge facing some UWB communications systems, is the external narrowband interference that can significantly degrade the performance of these systems. This result was revealed in a field experiment where the performance of one UWB communication system, according to one embodiment, was tested and evaluated in real conditions.

In order to overcome the vulnerability of some UWB communications systems to external interference sources, Software Defined Radio (SDR) is considered an enabling technology that moves as much of the processing in the radio from fixed hardware to software, making the function of the radio more configurable. This flexibility offers numerous advantages over conventional fixed radio architectures. Using an SDR platform, a class of TR modulation techniques can be implemented in software so the communications system can adapt to its environment by simply changing parameters such as operating frequency, pulse shape, delay between the pulses, delay between the symbols, pulse width, and modulation scheme on-the-fly. In addition, operating parameters such as encryption, error correction, and power output can be changed without replacing the system hardware. This improved adaptability opens opportunities for reducing the cost and size of a communication system. SDR allows for variation in modulation schemes and may accommodate a number of algorithms for acquisition and synchronization, depending on the changes in operating environment.

In some embodiments, the system design may be based on various wideband and UWB pulse based approaches that attempt to resolve the critical issues for low-power, synchronization, propagation path equalization, and platform mobility. The goal is to improve the performance of UWB communications systems by moving the modulation technique to software and adding an interference modulation technique to overcome the degrading effect that external narrowband interferences can bring to the system. By adding the interference mitigation techniques to software defined radio, a robust communications solution that can work in both multipath environments (ships) and in the presence of external interference, according to some approaches.

In one embodiment, a RF communications system 700 includes a satellite uplink base station 710, one or more ultra-wideband (UWB) capable radios 702, and one or more endpoint devices 730. Any of the UWB capable radios 702 and endpoint devices 730 as described above may be used, such as the UWB capable radios being a commercial off the shelf (COTS) device capable of data and voice communications having an UWB radio interface 736 for interfacing with a UWB radio 702, e.g. via interface 706, etc. As described directly below, any of the UWB capable radios 702 and endpoint devices 730 may be coupled via a network 738. Moreover, as described herein, any of the UWB capable radios 702 may include a processor 704 and software integrated and/or executable by the processor 704, the software being configured to cause the processor 704 to jam one or more undesired signals 740 by emitting one or more jamming signals 742 towards a source 744 of the one or more undesired signals 740. Also, the satellite uplink base station 702 may include any of the descriptions previously presented.

In one approach, the Emergency Communications Network may be used to communicate between the one or more endpoint devices 730 and the satellite uplink base station 710. Of course, any other communications network may be used instead, or as a primary communications network, a backup communications network, etc. For example, a first communications network may primarily be used, but in the event of a failure, the Emergency Communications Network may be used.

In another approach, the satellite uplink base station may include a router 712, a power supply 714, and a BGAN satellite uplink 716 capable of maintaining a satellite uplink while in motion. This allows for the system to be in motion and still be capable of communication support for the endpoint devices 730.

According to one approach, the UWB capable radios may be SDR systems. This allows for more efficient and flexible designs, which may be updated and/or modified depending on the characteristics of the environment in which they are to be used. For example, endpoint devices which will be used in densely urban areas may have different characteristics than endpoint devices for use in ship to ship communications.

In some preferred approaches, the UWB capable radios may use multipulse modulation. This increases the ability of the radios to communicate in some harsh environments. According to one approach, multipulse modulation may include transmitting a data pulse separated in time from a reference pulse, where the data pulse is modulated with data, and the reference pulse is unmodulated. Any of the previous descriptions of multipulse modulation may be included here as well.

In a further embodiment, the data pulse and the reference pulse may be wideband pulses chosen from a group consisting of: Gaussian, chirp, and Hermite-based. In other embodiments, the pulses may be narrow-band or UWB, etc. In another embodiment, the data pulse may be modulated with data based on a relative polarity of the data pulse and the reference pulse, as previously described.

In another approach, the UWB capable radios may use multipath receivers to enhance a signal-to-noise (SNR) ratio, as previously described. In additional embodiments, the UWB capable radios may include an omni-antenna capable of receiving UWB signals, which allows the radios to outperform radios having directional antennas.

Figure 5:
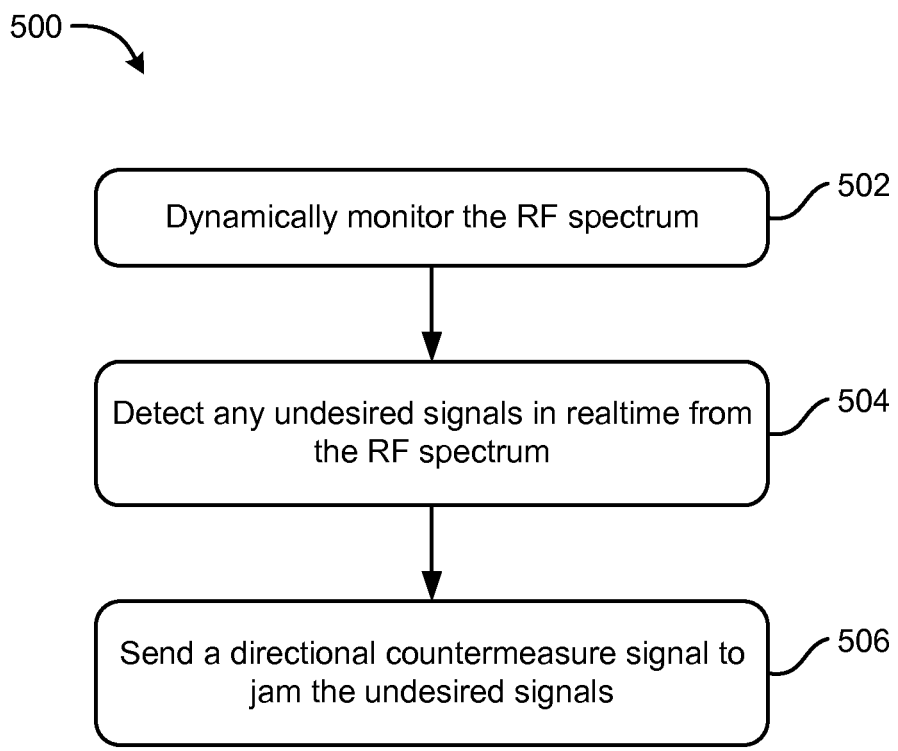
FIG. 5 shows a flow chart of a method, according to one embodiment.

Now referring to FIG. 5, a method 500 for adaptive RF jamming is shown according to one embodiment. This method 500 may be carried out in any desired environment, and may be applied to any embodiments and/or approaches described in FIGS. 1-4, according to various embodiments.

In operation 502, a RF spectrum is dynamically monitoring. This monitoring may be for many different reasons. In one preferred embodiment, the RF spectrum is being monitored for desired signals (such as incoming radio transmissions) and undesired signals (such as interference on specific frequencies and/or from a specific direction where desired signals may originate, may reflected from, etc.).

In operation 504, any undesired signals are detected in real time from the RF spectrum. This is possible due to the advancements disclosed herein. By detecting undesired signals from the broad RF spectrum, a course of action may be determined to account for and/or defeat these interfering signals.

In operation 506, a directional countermeasure signal is sent to jam the undesired signals. This directional countermeasure signal may be narrow-band to focus on a narrow range of frequencies in the RF spectrum, wideband to cover a wide range of frequencies in the RF spectrum, or UWB to cover a very wide range of frequencies in the RF spectrum. Also, the directional countermeasure signal may be sent only to a direction in which the undesired signals are originating from, being reflected from, etc., or it may be sent out widely to cover many angles of reception.

Figure 6:
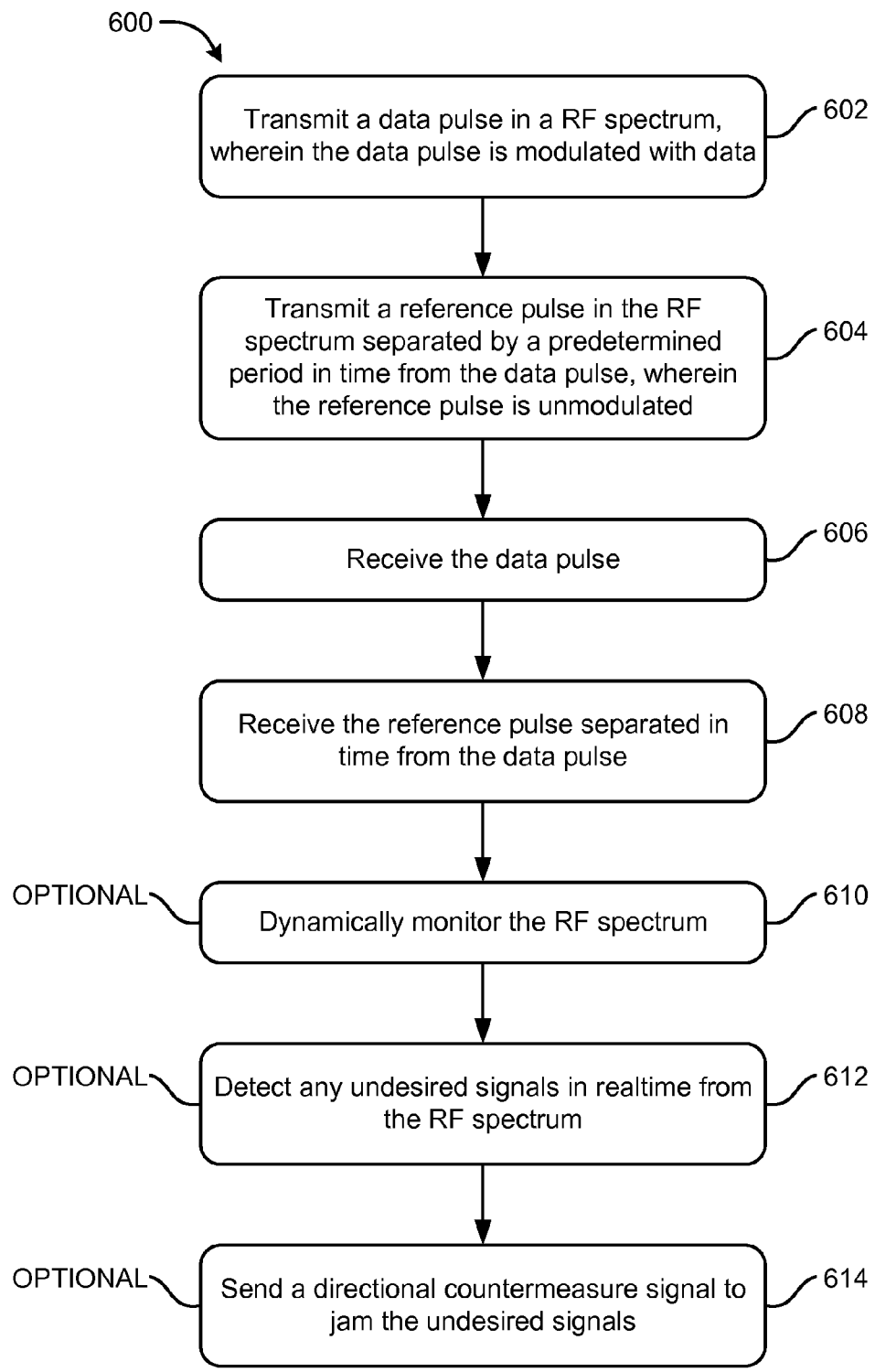
FIG. 6 shows a flow chart of a method, according to one embodiment.
Figure 7:
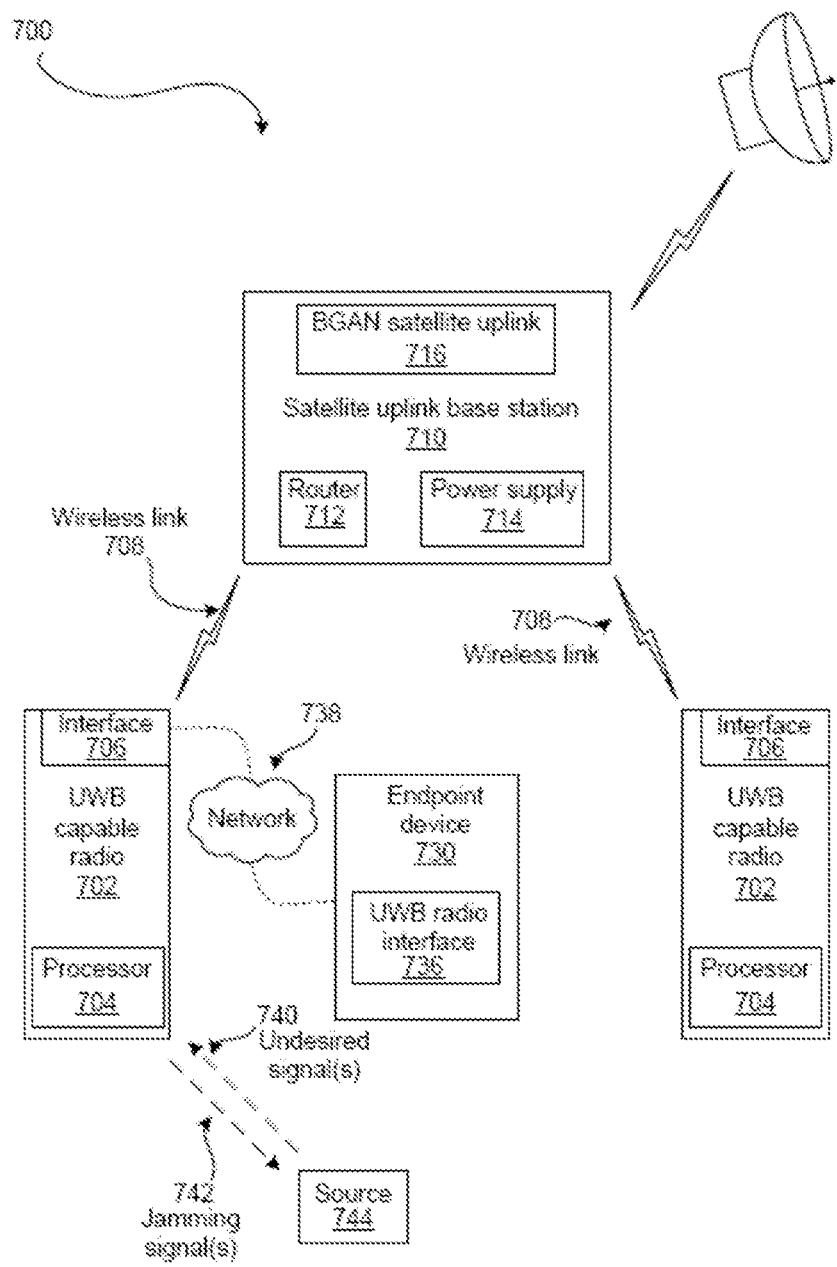
FIG. 7 is a schematic diagram of a Radio Frequency (RF) communications system, according to one embodiment.

Now referring to FIG. 6, a method 600 for adaptive RF communications is shown according to one embodiment. This method 600 may be carried out in any desired environment, and may be applied to any embodiments and/or approaches described in FIGS. 1-4, according to various embodiments. Note also that the method 600 may include methodology performed at the sending and receiving systems. It should be understood that some of the steps may be performed by individual embodiments, e.g., the sending system may perform operations 602 and 604, while the receiving system may perform operations 606 and 608, where the sending and receiving systems are individual embodiments. In other approaches, a system at a given end may perform all of the steps during various stages in a communication, e.g., when receiving a signal and responding thereto.

In operation 602, a data pulse is transmitted in a RF spectrum. The data pulse is modulated with data, such that any information that is to be sent is encapsulated within a series of data pulses.

In operation 604, a reference pulse is transmitted in the RF spectrum separated by a predetermined period in time from the data pulse. The reference pulse is unmodulated, such that it provides a reference with which the data pulse can be compared.

In operation 606, the data pulse is received. Any method may be used to receive the data pulse, including those described above.

In operation 608, the reference pulse is received separated in time from the data pulse. The separation in time may be different from the predetermined period, but each received set of pulses (data pulse and reference pulse) will be altered in a same way, thereby allowing demodulation thereof and retrieval of information from the signal.

In a further embodiment, the method 600 may further include the following operations.

In optional operation 610, the RF spectrum is dynamically monitoring. This monitoring may be for many different reasons. In one preferred embodiment, the RF spectrum is being monitored for desired signals (such as incoming radio transmissions) and undesired signals (such as interference on specific frequencies and/or from a specific direction where desired signals may originate, may reflected from, etc.).

In optional operation 612, any undesired signals are detected in real time from the RF spectrum. This is possible due to the advancements disclosed herein. By detecting undesired signals from the broad RF spectrum, a course of action may be determined to account for and/or defeat these interfering signals.

In optional operation 614, a directional countermeasure signal is sent to jam the undesired signals. This directional countermeasure signal may be narrow-band to focus on a narrow range of frequencies in the RF spectrum, wideband to cover a wide range of frequencies in the RF spectrum, or UWB to cover a very wide range of frequencies in the RF spectrum. Also, the directional countermeasure signal may be sent only to a direction in which the undesired signals are originating from, being reflected from, etc., or it may be sent out widely to cover many angles of reception.

According to one embodiment, the method 600 may also include using a multipath source to enhance a signal-to-noise (SNR) ratio of the received data pulse and the received reference pulse, as described previously.

The description herein is presented to enable any person skilled in the art to make and use the invention and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Directional signals such as the jamming signals may be sent, e.g., using a directional antenna of a type known in the art, such as a patch antenna, omnidirectional antenna with reflector or shielding to direct or limit the RF signals being emitted, etc. Moreover, the receive and transmit channels of the communications system may include components known in the art and, if needed, configured to operate with or in the embodiments disclosed herein.

The program environment in which one embodiment of the invention may be executed illustratively incorporates one or more general-purpose computers or special-purpose devices such hand-held computers. Details of such devices (e.g., processor, memory, data storage, input and output devices) are well known and are omitted for the sake of clarity.

It should also be understood that the techniques of the present invention might be implemented using a variety of technologies and/or types of logic. For example, the methods described herein may be implemented in software running on a computer system, or implemented in hardware utilizing one or more processors (e.g. processors 704) and logic (hardware and/or software) for performing operations of the method, application specific integrated circuits, programmable logic devices such as Field Programmable Gate Arrays (FPGAs), and/or various combinations thereof. In particular, methods described herein may be implemented by a series of computer-executable instructions residing on a storage medium such as a physical computer-readable medium. In addition, although specific embodiments of the invention may employ object-oriented software programming concepts, the invention is not so limited and is easily adapted to employ other forms of directing the operation of a computer.

The invention can also be provided in the form of a computer program product comprising a physical computer readable medium having computer code thereon. A computer readable medium can include any physical medium capable of storing computer code thereon for use by a computer, including optical media such as read only and writeable CD and DVD, magnetic memory or medium (e.g., hard disk drive), semiconductor memory (e.g., FLASH memory and other portable memory cards, etc.), etc. A computer readable medium may also include a signal medium such as a wire, network link, wireless link (e.g. wireless link 708), etc. across which data and/or instructions may be transmitted.

In use, various embodiments may be used in dense urban environment, tunnel communication, shipboard communications, ship to ship, or ship to shore communications, long rage RFID readers for passive and active tags, etc. Additional uses may be for reliable communications systems for fire fighter, rescue workers, mine communications, etc.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for adaptive Radio Frequency (RF) communications, the method comprising:
   transmitting a data pulse in a RF spectrum, wherein the data pulse is modulated with data; and
   after transmitting the data pulse, transmitting a reference pulse separated by a predetermined period of time from the data pulse, wherein the reference pulse is unmodulated but otherwise identical to the data pulse, wherein the reference pulse is configured to serve as a correlation template for the data pulse;
   dynamically monitoring the RF spectrum;
   detecting any undesired signals in real time from the RF spectrum; and
   sending directional countermeasure signals to jam the undesired signals simultaneously, wherein the directional countermeasure signals are adaptively generated in real-time according to a bandwidth of the undesired signals;
   wherein the bandwidth is in a range from a narrow bandwidth to an ultra-wide bandwidth (UWB) to cover a very wide range of frequencies to jam many interferers at once; and
   wherein the directional countermeasure signals are sent by an antenna that directs the countermeasure signals towards a source of the undesired signals without interfering with friendly communication devices sending desired signals.

2. The method of claim 1, further comprising:
   using at least one ultra-wideband (UWB) radio to perform at least one of:
      the transmitting of the data and reference pulses;
      the dynamic monitoring of the RF spectrum;
      the detecting of any undesired signals in real time from the RF spectrum; and
      the sending of one or more directional countermeasure signals to jam the undesired signals simultaneously,
   wherein the at least one UWB radio comprises one or more interfaces configured to couple to one or more endpoint devices,
   wherein at least one of the endpoint devices is operatively coupled to a maritime vessel.

3. The method of claim 2, wherein the at least one UWB radio includes a software-defined radio (SDR) system, and the method further comprising using the at least one UWB radio to communicate with a satellite uplink base station via wireless communications that are controlled by the SDR system thereof.

4. The method of claim 3, comprising performing multi-pulse modulation using the SDR system.

5. The method of claim 4, wherein multipulse modulation comprises modulating the data pulse with the data based on a relative polarity of the data pulse and the reference pulse.

6. The method of claim 3, comprising using the SDR system to perform Transmit-Reference (TR) modulation in real-time.

7. The method of claim 6, wherein performing TR modulation in real-time comprises adaptively changing at least two of the following parameters of the SDR system in real-time:
   an operating frequency,
   a pulse shape,
   a delay between pulses,
   a delay between symbols,
   a pulse width,
   a modulation scheme,
   an encryption,
   an error correction, and
   a power output.

8. The method of claim 2, comprising using multipath receivers of the at least one UWB radio to use to enhance a signal-to-noise (SNR) ratio of signals received by the at least one UWB radio.

9. The method of claim 2, comprising:
   interfacing with an endpoint device via the at least one UWB radio;
   initiating communications between a satellite uplink base station and the endpoint device across a primary communication network;
   detecting a failure in the primary communications network; and
   initiating communications between the satellite uplink station and the endpoint device across a backup communications network in response to detecting the failure in the primary communications network.

10. The method of claim 1, comprising maintaining an uplink between a base station and a broadband global area network (BGAN) satellite while the base station is in motion.

11. The method of claim 1, wherein the directional countermeasure signals are narrow-band to focus on a narrow range of frequencies in the RF spectrum.

12. The method of claim 1, wherein the directional countermeasure signals are ultra-wideband to cover a very wide range of frequencies in the RF spectrum.

13. The method of claim 1, wherein the directional countermeasure signals comprise at least two of: a narrow-band signal to focus on a narrow range of frequencies in the RF spectrum; a wideband signal to cover a wide range of frequencies in the RF spectrum; and an ultra-wideband signal to cover a very wide range of frequencies in the RF spectrum.

14. The method of claim 1, wherein the antenna is an omnidirectional antenna comprising a reflector and/or shielding configured to direct the countermeasure signals towards the source of the undesired signals.

15. The method of claim 1, wherein the data pulse and the reference pulse are wideband pulses chosen from a group consisting of: Gaussian, chirp, and Hermite-based.

16. A method for adaptive Radio Frequency (RF) communications, the method comprising:
transmitting a data pulse in a RF spectrum, wherein the data pulse is modulated with data; and
after transmitting the data pulse, transmitting a reference pulse separated by a predetermined period of time from the data pulse, wherein the reference pulse is unmodulated but otherwise identical to the data pulse, wherein the reference pulse is configured to serve as a correlation template for the data pulse;
dynamically monitoring the RF spectrum;
detecting any undesired signals in real time from the RF spectrum;
sending directional countermeasure signals to jam the undesired signals simultaneously, wherein the directional countermeasure signals are adaptively generated in real-time according to a bandwidth of the undesired signals, the bandwidth being in a range from a narrow bandwidth to an ultra-wide bandwidth (UWB) to cover a very wide range of frequencies to jam many interferers at once, wherein the directional countermeasure signals are sent by an antenna that directs the countermeasure signals towards a source of the undesired signals without interfering with friendly communication devices sending desired signals;
interfacing with an endpoint device;
initiating communications between a satellite uplink base station and the endpoint device across a primary communication network;
detecting a failure in the primary communications network; and
initiating communications between the satellite uplink station and the endpoint device across a backup communications network in response to detecting the failure in the primary communications network.

17. A system for adaptive Radio Frequency (RF) communications, the system comprising an ultra-wideband (UWB) radio configured to:
transmit a data pulse in a RF spectrum, wherein the data pulse is modulated with data; and
after transmitting the data pulse, transmit a reference pulse separated by a predetermined period of time from the data pulse, wherein the reference pulse is unmodulated but otherwise identical to the data pulse, wherein the reference pulse is configured to serve as a correlation template for the data pulse;
dynamically monitor the RF spectrum;
detect any undesired signals in real time from the RF spectrum; and
sending directional countermeasure signals to jam the undesired signals simultaneously, wherein the directional countermeasure signals are adaptively generated in real-time according to a bandwidth of the undesired signals;
wherein the bandwidth is in a range from a narrow bandwidth to an ultra-wide bandwidth (UWB) to cover a very wide range of frequencies to jam many interferers at once; and
wherein the directional countermeasure signals are sent by an antenna that directs the countermeasure signals towards a source of the undesired signals without interfering with friendly communication devices sending desired signals.

18. The system of claim 17, wherein the UWB radio is a software-defined ratio (SDR) system.

19. The system of claim 17, comprising a satellite uplink base station configured to communicate with the UWB radio using wireless communications, wherein the satellite uplink base station comprises:
a router;
a power supply configured to provide power to the uplink base station; and
a broadband global area network (BGAN) satellite uplink configured to maintain a satellite uplink while the satellite uplink base station is in motion, wherein the BGAN satellite uplink is operatively coupled to the router.

* * * * *